United States Patent [19]
Vines et al.

[11] Patent Number: 5,329,161
[45] Date of Patent: Jul. 12, 1994

[54] MOLYBDENUM BORIDE BARRIER LAYERS BETWEEN ALUMINUM AND SILICON AT CONTACT POINTS IN SEMICONDUCTOR DEVICES

[75] Inventors: Landon Vines, San Antonio; John Cain, Schertz; Chang-Ou Lee, San Antonio; Sigmund Koenigseder, San Antonio; Felix Fujishiro, San Antonio, all of Tex.

[73] Assignee: VLSI Technology, Inc., San Jose, Calif.

[21] Appl. No.: 918,728

[22] Filed: Jul. 22, 1992

[51] Int. Cl.$^5$ .............. H01L 23/48; H01L 23/52; H01L 29/40; H01L 29/76
[52] U.S. Cl. ................... 257/764; 257/383; 257/751; 257/763; 257/770
[58] Field of Search .................. 357/65, 67, 71; 257/382, 383, 751, 763, 764, 768, 770

[56] References Cited

U.S. PATENT DOCUMENTS

| | | | |
|---|---|---|---|
| 4,782,380 | 11/1988 | Sankar et al. | 357/71 R |
| 4,887,146 | 12/1989 | Hinode | 357/71 |
| 4,897,709 | 1/1990 | Yokoyama et al. | 357/71 R |
| 4,965,656 | 10/1990 | Koubuchi et al. | 357/71 |
| 4,976,839 | 12/1990 | Inoue | 357/71 |
| 5,061,985 | 10/1991 | Meguro et al. | 357/71 |

OTHER PUBLICATIONS

Wolf, "Silicon Processing for the VLSI Era", vol. 2, Lattice Press, Sunset Beach, California, pp. 121-128 (1990).

Primary Examiner—Rolf Hille
Assistant Examiner—Steven Loke
Attorney, Agent, or Firm—Burns, Doane, Swecker & Mathis

[57] ABSTRACT

Increases in the contact resistance at the aluminum-silicon interface in contact points is inhibited by employing a molybdenum boride conductive barrier layer between the aluminum conductor and the silicon substrate.

8 Claims, 2 Drawing Sheets

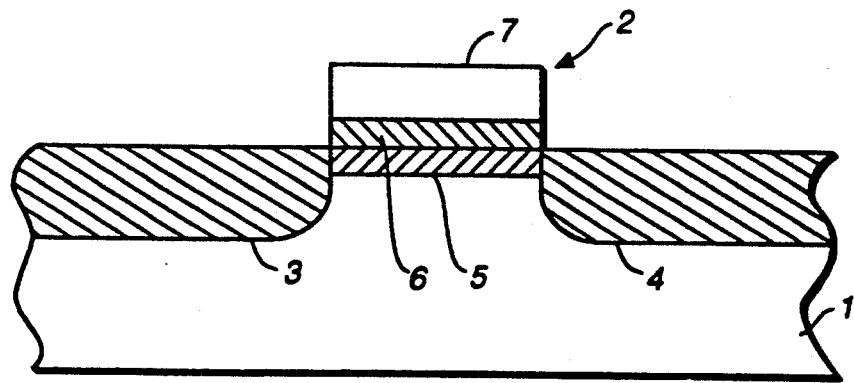
FIG._1
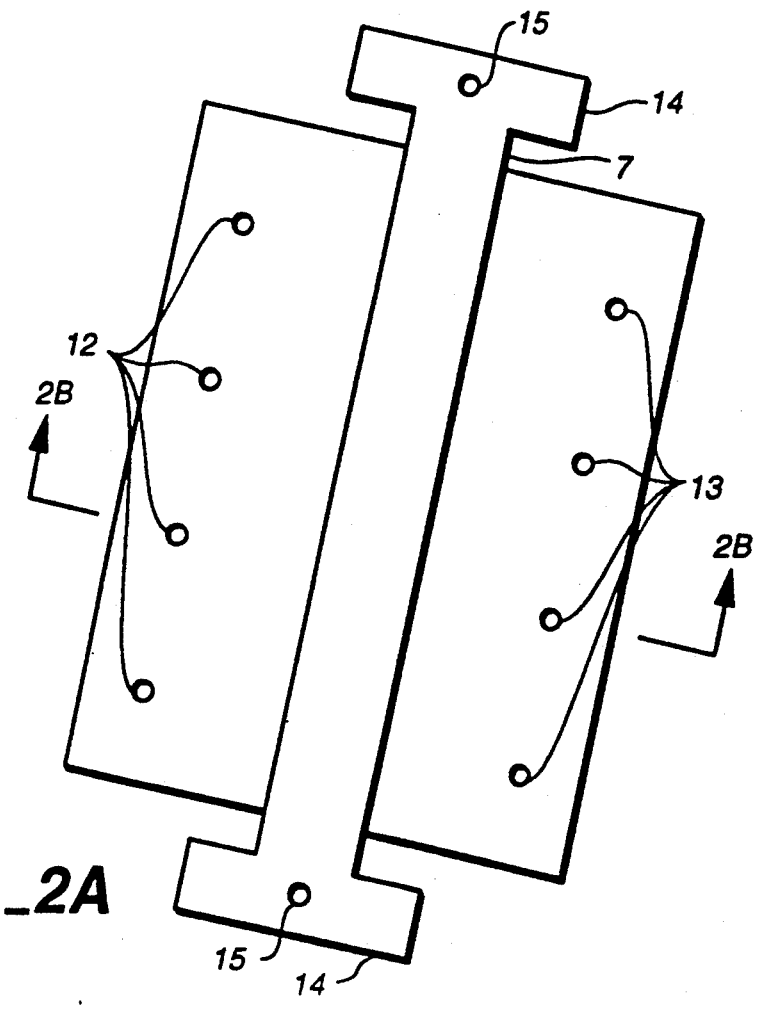
FIG._2A

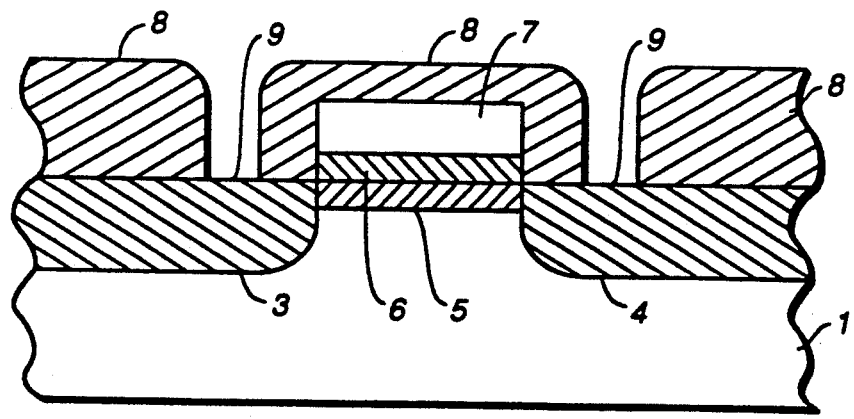
FIG._2B
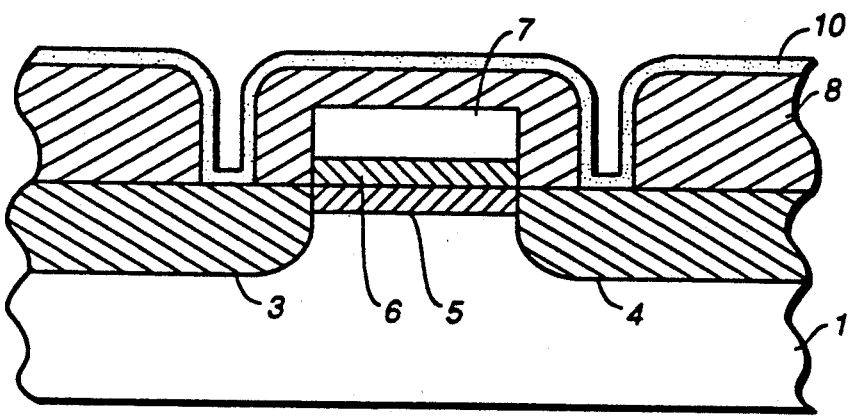
FIG._3A
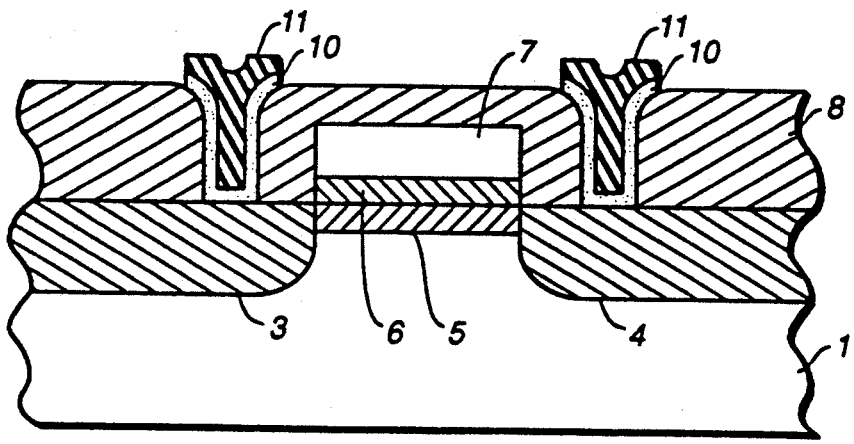
FIG._3B

MOLYBDENUM BORIDE BARRIER LAYERS BETWEEN ALUMINUM AND SILICON AT CONTACT POINTS IN SEMICONDUCTOR DEVICES

BACKGROUND OF THE INVENTION

1. Field or the Invention

This invention is directed to methods for inhibiting increases in contact resistance in aluminum silicon interfaces at contact points between aluminum and silicon (e.g., silicon substrates) in semiconductor devices as well as the devices produced by these methods. The methods of this invention are achieved by employing a molybdenum boride conductive barrier layer interposed between the aluminum and the silicon.

2. State of the Art

In semiconductor devices, aluminum wires are placed over the surface of the silicon substrate and are generally separated from the silicon and other aluminum wires by dielectric insulation layers except at contact points such as circuit elements (e.g., transistor sites). At such contact points, the aluminum and silicon interface (contact) with each other thereby allowing current to flow from the aluminum wire to the silicon. Such interfaces, however, also have an associated contact resistance.

In regard to the above, the resistance at the contact point of the aluminum and silicon is inversely proportional to the surface area of contact. That is to say that the smaller the surface area of the contact, the higher the contact resistance. Because of the increased density of circuit elements on the surface of semiconductor devices, particularly in very large scale integration (VLSI) devices, it is increasingly necessary to reduce the surface area of contact points on the semiconductor device which, necessarily, increases the contact resistance at these points. When the contact resistance surpasses a designated maximum, contact failure can occur which adversely effects the performance of the semiconductor device. See, for example, Wolf, "Silicon Processing for the VLSI Era", Vol. 2, Lattice Press, Sunset Beach, Calif., pp. 121-128 (1990).

While the specific contact resistance for a given contact point can be controlled to a certain extent by controlling the surface area of the contact point, several other factors, which are independent of the surface area of the contact point, also can effect contact resistance and the functionality of the contact point. For example, at high temperatures, i.e., $T \geq 350°$ C., silicon becomes soluble to a significant extent in the aluminum of the aluminum wire, e.g., silicon has a solubility of 0.5 atomic percent in aluminum at 450° C. Accordingly, at high temperatures, if the silicon physically contacts aluminum, then it will diffuse into the aluminum wire. In this case, silicon diffusion results in the formation of "voids" in the silicon substrate at the contact point. This, in turn, results in undesirable increases in contact resistance.

In regard to the above, it is noted that semiconductor devices are routinely processed at high temperatures (e.g., temperatures up to 650° C.) after the silicon aluminum interfaces have been formed. For example, during the packaging step of the completed semiconductor device, the device is generally encased in a plastic wrap which employs processing temperatures of about 600° C. At such processing temperatures, silicon diffusion into the aluminum wire at the contact points of the device can result in undesirable increases in the contact resistance which, in the case of a highly integrated semiconductor device (i.e., a device containing a high density of circuit elements), can result in contact failure at one or more of the contact points.

Accordingly, in such highly integrated semiconductor devices, the art has been searching for methods for inhibiting undesirable increases in contact resistance at the aluminum silicon interfaces in semiconductor devices. In this regard, it has been proposed that silicon diffusion into the aluminum wire at the contact point can be reduced by the incorporation of a small amount of silicon into the aluminum wire. In fact, there are some commercially available semiconductor devices which utilize up to about 1.0 atomic percent silicon in the aluminum wire. This proposed solution, however, does not stop silicon diffusion into the wire at high temperatures and, in fact, causes an additional problem.

Specifically, it has been discovered that in spite of doping the aluminum wire with silicon, any silicon in contact with the aluminum wire will still diffuse into the wire at high temperatures causing "voids" inside the contact point on the silicon surface which increase the resistance at the contact point. Additionally, it has been discovered that, at high temperatures, the silicon originally doped in the aluminum wire migrates from the wire and precipitates onto the surface of the silicon in contact with the wire (e.g., a silicon substrate). Such precipitation reduces the contact area between the aluminum wire and the silicon contacting the wire which further increases the contact resistance. Accordingly, in some cases, the net effect of doping the aluminum wire with silicon is to increase the resistance at the contact point as compared to the contact resistance of silicon-/aluminum interfaces where the aluminum does not contain doped silicon.

It has also been proposed to use a conductive barrier layer between the aluminum wire and the silicon in contact with the wire. See, for example, Wolf, supra. In order to be effective, the barrier layer should, among other parameters, meet the following criteria:

1. the barrier material should be chemically inert to silicon and aluminum;
2. the diffusion of silicon and aluminum through the barrier layer should be low (i.e., there should be little or no solubility of silicon or aluminum in the barrier material); and
3. the barrier material must be conductive with a maximum allowable resistivity of about 200 $\mu\Omega$-centimeter.

In this regard, barrier layers containing either a conductive titanium nitride or titanium tungsten film have been commercially employed and are placed between the aluminum and silicon at the contact points. While these barrier layers meet some of the criteria recited above and, accordingly, offer a degree of inhibition to increases in the contact resistance brought about by silicon diffusion, these barrier layers are thermally unstable at temperatures greater than 500°-550° C. These barrier layers are thermally unstable because at temperatures greater than 500°-550° C., they no longer able to prevent silicon diffusion through the barrier layer and into the aluminum. As noted above, such diffusion will result in increases in contact resistance. Thus, when the semiconductor device containing aluminum/silicon contact points is processed at temperatures greater than 550° C., and especially at temperatures greater than 600° C., these barrier layers offer little, if any, inhibition to increases in contact resistance.

The present invention is directed to the discovery of a new barrier layer material which possesses excellent conductivity, high thermal stability, and very low silicon solubility and, accordingly, is particularly effective in reducing increases in contact resistance due to silicon diffusion into the aluminum wire at silicon/aluminum contact points in semiconductor devices.

SUMMARY OF THE INVENTION

The present invention is directed to the discovery that increases in resistance at the silicon aluminum contact points (interfaces) in semiconductor devices due to silicon diffusion into the aluminum wire can be inhibited, even at temperatures up to 650° C., by placing a molybdenum boride barrier layer between the silicon and the aluminum at the contact points.

Accordingly, in one of its method aspects, the present invention is directed to a method for inhibiting increases in contact resistance in semiconductor devices containing silicon/aluminum contact points which method comprises placing a molybdenum boride barrier layer between the silicon and aluminum at such contact points.

In another of its method aspects, the present invention is also directed to a method for inhibiting increases in contact resistance in semiconductor devices containing a silicon substrate, a plurality of insulation zones on the surface of the substrate which define a plurality of contact points on the silicon substrate, and aluminum wires which are placed over the insulation zones and contact the substrate only at a plurality of contact points which method comprises the steps:

(a) forming an insulation layer on the surface of the substrate;

(b) selectively etching said insulation layer so as to form a plurality of insulation zones and a plurality of contact points with the surface of the substrate;

(c) depositing a layer of molybdenum boride over the surface of the substrate formed in step (b) above;

(d) depositing an aluminum layer on the surface of the molybdenum boride layer formed in step (c) above;

(e) selectively placing a photoresist layer over the aluminum layer formed in step (d) so as to define interconnect lines or wires on the aluminum layer;

(f) removing the aluminum and molybdenum boride layers from the surface of the substrate formed in step (e) above except under the photoresist layer; and (g) removing the photoresist layer.

In one of its composition aspects, the present invention is directed to an integrated circuit comprising:

(a) a silicon substrate;

(b) a plurality of aluminum wires placed over the substrate and vertically spaced apart from each other and the substrate by insulation layers wherein the wires are in electrical contact with the substrate at a plurality of contact points; and (c) a conductive molybdenum boride barrier layer placed between the substrate and the aluminum wires at the contact points so that the substrate and the aluminum wires are in electrical contact with each other.

Preferably, the insulating layers described above are silicon dioxide ($SiO_2$) layers.

In another preferred embodiment, the contact points are those points on the silicon substrate surface doped with either a P-type or N-type dopant so as to define source or drain sites on a transistor element of the semiconductor device.

BRIEF DESCRIPTION OF THE DRAWINGS

FIG. 1 illustrates a cross-sectional view of a semiconductor device having a partially fabricated transistor element on the surface thereof.

FIG. 2A illustrates a partial overview of the semiconductor device of FIG. 1 which further comprises silicon dioxide insulating zones on the surface so as to define a plurality of contact points.

FIG. 2B illustrates a cross-sectional view of the semiconductor device of FIG. 2A taken along lines 2B—2B.

FIG. 3A illustrates the semiconductor device of FIG. 2B which further comprises the deposition of a conductive barrier layer of molybdenum boride over the substrate surface.

FIG. 3B illustrates the semiconductor device of FIG. 3A where an aluminum layer has been deposited on the substrate surface (not shown) and where the aluminum and molybdenum boride layers have been patterned so as to provide for aluminum wires (metallization lines) placed over a conductive barrier layer of molybdenum boride. Because molybdenum boride is conductive, the aluminum wires are in electrical contact with the substrate at the contact points.

DETAILED DESCRIPTION OF THE PREFERRED EMBODIMENTS

As noted above, the present invention is directed, in part, to methods for inhibiting increases in contact resistance in aluminum silicon interfaces at contact points in semiconductor devices by employing a molybdenum boride conductive barrier layer interposed between the aluminum and silicon at such contact points.

However, prior to discussing this invention in further detail, the following terms will first be defined:

Definitions

As used herein, the following terms have the following meanings:

The term "contact points" refers to the points on a semiconductor device where an aluminum wire contacts silicon. Such contact points occur, for example, at circuit elements found on the surface of the substrate. The contact points are typically made by forming a layer of dielectric (typically $SiO_2$) on the surface of the silicon substrate and then selectively etching away the dielectric at the to be formed contact points so as to expose the substrate at these points. Typical contact points include the doped regions of the silicon substrate which correspond to the source and drain sites of a transistor.

Conventionally, metallization interconnect lines (aluminum wires) are next placed on the surface of the device via conventional methods so that the wires contact the surface of the substrate only at the contact points described above.

The term "insulating or insulation layer" refers to a layer of non-conductive material deposited or formed on the surface of the silicon substrate so that the portions of the metallization lines formed on the surface of the insulating layers are not in electrical contact with the substrate. The non-conductive material is generally doped or undoped silicon dioxide ($SiO_2$), polyimide, and the like and is placed over the surface of the substrate by conventional techniques so as to provide a sufficient thickness so that an insulation layer is formed. In general, the thickness of the insulation layer is at least about 200 nanometers (nm) and preferably from about 200 to about 1,000 nm.

After the insulation layer has been patterned by etching to provide noncontiguous insulation regions (in a cross-sectional view), these regions are referred to "insulation zones" which, of course, are derived from the same insulation layer.

The term "aluminum" refers to metallic aluminum as well as alloys of aluminum conventionally employed in semiconductor devices.

The term "aluminum wires" refers to aluminum interconnect lines formed on the semiconductor device. Typically, an aluminum layer is first deposited on the surface of the substrate containing an insulation layer which has been selectively etched away to define contact points with the substrate. The aluminum layer is typically formed by evaporative deposition to a thickness of about 500 to about 1,500 nm. The aluminum layer is then patterned by conventional lithographic techniques to form a plurality of interconnect lines (aluminum wires) on the surface of the semiconductor device, which do not cross each other and which contact the substrate surface only at the contact points.

The term "molybdenum boride" refers to the compositions containing molybdenum and boron. Preferably, the molybdenum boride is represented by the formula $MoB_x$ where x has a value of from about 1.0 to about 2.0 and preferably about 1.7. Such compositions are thermally stable up to about 650° C., have a resistivity at about 18°-22° C. of about 25 $\mu\Omega$-cm, and possess minimal silicon solubility. For example, at 450° C., silicon has a solubility in molybdenum boride of less than about 0.01 atomic percent. In contrast, at 450° C., silicon has a solubility in aluminum of 0.5 atomic percent.

The term "molybdenum boride barrier layer" refers to a layer of molybdenum boride placed between the silicon and aluminum interfaces in semiconductor devices wherein the barrier layer is of sufficient thickness so as to retard diffusion of silicon into the aluminum at temperatures up to about 650° C. In a preferred embodiment, the barrier layer has a thickness of at least about 30 nm and more preferably, from about 30 nm to about 120 nm.

The term "electrical contact" refers to arrangements where silicon and aluminum, while not in physical contact with each other, are in electrical contact with each other so that a current will flow from (or to) the aluminum to (or from) the silicon. Thus, the placement of a conductive barrier layer at the contact points between silicon and aluminum interfaces will interrupt physical contact between the silicon and the aluminum but not the electrical contact.

Preparation of the Molybdenum Boride

The molybdenum boride composition employed to prepare the barrier layer is readily prepared by conventional techniques. For example, molybdenum boride can be formed using molybdenum hexafluoride and diborane as the gas sources. Both gases are injected into a reaction chamber, e.g., a CVD reaction chamber, optionally in the presence of an inert carrier gas such as helium, argon, hydrogen. Reaction occurs by heating the chamber to a temperature of from about 300° C. to about 700° C. or by plasma treatment at low vapor pressure (i.e., generally from about 20 mtorr to 500 mtorr). The reaction proceeds as shown in reaction (1) below to form molybdenum boride:

(1)ps

In this reaction, the value of x is controlled by both the stoichiometry as well as the reaction conditions. Generally, x is controlled to be from about 1.0 to about 2.0 and preferably to about 1.7. The reaction is generally complete in about 0.5 to about 30 minutes.

Methodology

The semiconductor devices of this invention are prepared by depositing a molybdenum boride barrier layer over the surface of the semi-fabricated device and then completing fabrication. The semi-fabricated device contains a silicon substrate with numerous, partially fabricated circuit elements found on the surface thereof. A plurality of insulation zones are also found on the surface of the substrate so as to define a plurality of contact points.

Specifically, during fabrication, the silicon wafer is processed to contain numerous circuit elements, e.g., transistors, resistors, capacitors, etc. Transistor elements, for example, contain a source site and a reciprocal drain site which are connected to each other by a channel. Each of these elements are typically doped with Group III element(s) (P-type) such as boron or with Group V element(s) (N-type) such as phosphorus, arsenic, antimony, and the like. Typically, the dopant for the channel is different in type as compared to that for source site and drain site.

During fabrication of the semiconductor device, metallization interconnect lines (e.g., aluminum wires) are placed on the surface of the semi-fabricated device to connect the various circuit elements. In order to prevent contact of these lines with the substrate at points other than these intended sites, the substrate is first covered with an insulation layer of a suitable dielectric. Suitable dielectric materials are well known in the art and include materials such as undoped silicon dioxide, doped silicon dioxide, polyimides, and the like. The dielectric can be formed on the substrate by well known procedures including, by way of example, chemical vapor deposition (CVD), plasma enhanced chemical vapor deposition (PECVD), photoenhanced chemical vapor deposition, low pressure chemical vapor deposition (LPCVD), and the like. These procedures are disclosed by Wolf, "Silicon Processing for the VLSI Era" Vol. 1, Lattice Press, Sunset Beach, Calif., pp. 161-197 (1986). The insulation layer generally has a thickness of at least about 200 nm and preferably from about 200 nm to about 1,000 nm.

After the insulation layer is formed, a conventional photoresist layer is then placed over it in all areas except the to-be formed contact points. The insulation layer is then etched using conventional techniques which results in exposure of the substrate surface at the contact points. These exposure sites are sometimes referred as "contact holes". The photoresist is then removed using conventional methods.

Photoresists and their methods of application are well known in the art. For example, photoresists are described, for example, in U.S. Pat. Nos. 3,046,118; 3,046,121; 3,106,465; 3,201,239; 3,538,137; 3,666,473; 3,934,057; 3,984,582; and 4,007,047 the disclosures of which are incorporated herein by reference. Methods for removing the photoresist layers are also well known in the art and are described in U.S. Pat. No. 4,395,479 which is incorporated herein by reference.

At this point, the molybdenum boride barrier layer is then deposited over the surface of the substrate. This barrier layer is formed by conventional methods including CVD, PECVD, photoenhanced CVD, LPCVD (low pressure CVD), Rapid Thermal Processing (RTP) and the like. Specifically, the above-described reaction is conducted in a CVD reaction chamber (or other suitable chamber) in the presence of the wafer. Under the above-described reaction conditions, a layer of solid molybdenum boride is uniformly deposited over the substrate surface. The reaction conditions are controlled (e.g., reaction time, reagent amounts, etc.) so that this layer will have a thickness of at least about 30 nm and preferably from about 30 to 120 nm.

An aluminum layer is then conventionally deposited over the molybdenum boride layer to a thickness of about 500 to about 1,500 nm. The aluminum and molybdenum boride layers are then patterned by conventional lithographic techniques to form a plurality of interconnect lines (aluminum wires) on the surface of the semiconductor device so that the wires do not cross one another and which contact the substrate surface only at the contact points.

Patterning techniques are well known in the art and include placing a patterned photoresist layer on the surface of the aluminum layer. The patterned photoresist layer defines the to-be formed interconnect lines. The aluminum and molybdenum boride layers are then etched away on the entire surface of the substrate except, of course, under the photoresist layer. Etching methods are well known in the art and preferably the etching method employed uses chlorine based chemistry. Afterwards, the photoresist layer is removed by conventional techniques using suitable solvents such as solvents ST-20, ST-22, and ST-95 available from Advanced Chemical Systems International, Inc., Milpitas, Calif. 95035. At which time the wafer is removed from the chamber for further processing (fabrication).

In regard to the above, if connection of different transistor elements require crossing of two aluminum wires, then this is generally achieved by forming a first set of wires (separated from silicon at the contact points by a molybdenum boride barrier layer) over the surface of a first insulating layer so that the wires do not cross over one another and which are in electrical contact with the surface of the silicon substrate only at the contact points. A second insulating layer is then placed over the surface of the substrate and first set of wires. A new set of contact points are then formed on this surface followed by forming a second set of aluminum wires (separated from silicon at the contact points by a molybdenum boride barrier layer) over the surface of the second insulating layer so that the wires do not cross over one another and which contact the surface of the silicon substrate only at the second set of contact points. Each of these steps are conducted as described above. This procedure can be repeated to provide for a plurality of aluminum wires placed over the substrate and, where necessary, are vertically spaced apart from each other and the substrate by insulation layers wherein the wires are in electrical contact with the substrate at a plurality of contact points.

Figures

The present invention can be further understood by reference to the attached drawings. Specifically, FIG. 1 illustrates a cross-sectional view of a partially fabricated transistor element, such as transistor element 2, on the surface of substrate 1. Substrate 1 is part of a silicon wafer which has been processed by conventional techniques to produce a plurality of individual dies or chips. In general, the entire wafer will be subject to the processing steps which are described hereinafter. The drawing, however, illustrates only a small portion of the wafer substrate.

Further in this regard, transistor element 2 generally contains a source site 3 and a reciprocal drain site 4 which are connected by channel 5, each of which are typically doped with Group III element(s) (P-type) such as boron or with Group V element(s) (N-type) such as phosphorus, arsenic, antimony, and the like. Typically, the dopant for channel 5 is different in type as compared to that for source site 3 and drain site 4 (e.g., if channel 5 employs a P-type dopant, then source site 3 and drain site 4 will use an N-type dopant). The dopant serves, in part, to reduce resistance in the transistor.

In transistor element 2, $SiO_2$ layer 6 is position onto the surface of substrate 1 over channel 5. $SiO_2$ layer 6 serves as a "gate oxide" so that a minimum threshold voltage is required to activate the transistor. The $SiO_2$ gate oxide layer preferably has a thickness of from about 80 to about 200 Å and more preferably from about 80 to about 150 Å.

After formation of the gate oxide layer 6, gate 7, which is a layer of polysilicon, is formed over gate oxide layer 6. A layer of silicide (e.g., $MoSi_x$, $TiSi_x$, $WSi_x$, $TaSi_x$, $CoSi_x$, etc.), not shown, can optionally be placed over gate 7 to complete the transistor element 2.

FIG. 2A illustrates a partial overview of the semiconductor device of FIG. 1 which further comprises silicon dioxide insulating zones on the surface so as to define a plurality of contact points. Specifically, FIG. 2A is a partial overview of a partially fabricated semiconductor device having contact holes 12 contacting source sites 3 (not shown) and contact holes 13 contacting drain sites 4 (not shown). The polysilicon gate 7 terminates at both ends in contact regions 14 having contact holes 15.

FIG. 2B illustrates a cross-sectional view of semiconductor device of FIG. 2A taken along lines 2B—2B. Specifically, in FIG. 2B, a plurality of $SiO_2$ insulation zones 8 over the surface of substrate 1 define a plurality of contact points 9. The insulation zones 8 are formed by conventional means which include deposition of an $SiO_2$ insulation layer over the entire surface of the substrate 1. A conventional photoresist layer is then placed over the insulation layer in all areas except the to be formed contact points. The insulation layer is then etched using conventional techniques which results in the formation of the insulation zones 8 and exposure of the substrate surface at the contact points 9.

FIG. 3A illustrates the placement of a molybdenum boride barrier layer 10 on the surface of the substrate. This barrier layer is formed in the manner described above.

FIG. 3B illustrates the placement of aluminum wires (interconnect lines) 11 which run along the surface of the insulation zones 8 and contact the surface of the substrate at contact points 9. The aluminum wires are formed in the manner described above and interposed between the aluminum wires 11 and the silicon found in the source site 3 and drain site 4 is the molybdenum boride barrier layer 10.

In this regard and as noted above, during deposition, the molybdenum boride layer is deposited over the entire surface of substrate 1 including gate 7, contact regions 14, and the silicon substrate at contact points 15. Accordingly, deposition of the aluminum layer followed by patterning will result in the placement of a conductive molybdenum boride barrier layer at contact points 15 if the aluminum layer is patterned to form an aluminum wire at these points.

The following example is offered to illustrate the present invention and should not be construed in any way as limiting its scope.

EXAMPLES

A partially fabricated semiconductor device similar to that illustrated in FIGS. 2A and 2B is placed into a CVD reaction chamber (e.g., an Applied Materials 5000 Mark II CVD device available from Applied Materials, Santa Clara, Calif.). The pressure in the reaction chamber is reduced to between 20–200 millitorr (mtorr). Molybdenum hexafluoride ($MoF_6$) is introduced into the reaction chamber at a rate of from about 20–200 standard cubic centimeters per minute (SCCM). Sufficient borane ($B_2H_6$), diluted to a concentration of no more than 10 volume percent with hydrogen ($H_2$), is added to give a molybdenum to boron mole ratio (Mo:B) of from 1 to 2 (and preferably about 1.7). The reaction chamber is then heated for a period of from about 30 second to 2 minutes at about 600° to 700° C. so as to deposit from 30 nm to about 100 nm of $MoB_x$ over the surface of the partially fabricated semiconductor device. The device is then removed from the chamber and further fabricated by conventional techniques.

What is claimed is:

1. A semiconductor device comprising:
   (a) a silicon substrate;
   (b) a plurality of aluminum wires placed over the substrate and vertically spaced apart from each other and the substrate by insulating layers wherein the wires are in electrical contact with the substrate at a plurality of contact points; and
   (c) a conductive molybdenum boride barrier layer placed between and in physical contact with the substrate and the aluminum wires at the contact points so that the substrate and the aluminum wires are in electrical contact with each other wherein said molybdenum boride barrier layer comprises a composition represented by the formula $MoB_x$ where x has a value of from about 1.0 to about 2.0.

2. The semiconductor device according to claim 1 wherein the contact points on the substrate are doped with either a P-type or N-type dopant so as to define source or drain sites on a transistor element of the semiconductor device.

3. The semiconductor device according to claim 2 wherein the insulating layer is $SiO_2$.

4. The semiconductor device according to claim 3 wherein x has a value of about 1.7.

5. The semiconductor device according to claim 3 wherein the molybdenum boride barrier layer has a thickness of at least about 30 nm.

6. The semiconductor device according to claim 5 wherein the insulating layer has a thickness of at least about 200 nm.

7. The semiconductor device according to claim 1 wherein the molybdenum boride barrier layer is formed in a chemical vapor deposition process which comprises reacting molybdenum hexafluoride and diborane in a chemical vapor deposition reaction chamber by either heating the reactants at a temperature of from about 300° C. to about 700° C. or by plasma treatment at a vapor pressure of from about 20 to about 500 mtorr.

8. In a semiconductor device comprising a silicon substrate and circuit elements which include a plurality of aluminum wires placed over the substrate and vertically spaced apart from each other and the substrate by insulating layers of dielectric wherein the wires are in electrical contact with the substrate at a plurality of contact points wherein the improvement comprises a conductive molybdenum boride barrier layer positioned between and in physical contact with the substrate and the aluminum wires at the contact points so that while the substrate and the aluminum wires are in electrical contact with each other they are not in physical contact with each other wherein said molybdenum boride barrier layer comprises a composition represented by the formula $MoB_x$ where x has a value of from about 1.0 to about 2.0.

* * * * *